(12) United States Patent
Jones et al.

(10) Patent No.: US 10,960,603 B2
(45) Date of Patent: Mar. 30, 2021

(54) SCANNING STRATEGY FOR PERIMETER AND REGION ISOLATION

(71) Applicant: GENERAL ELECTRIC COMPANY, Schenectady, NY (US)

(72) Inventors: Lucas Jones, West Chester, OH (US); Justin Mamrak, Loveland, OH (US)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 0 days.

(21) Appl. No.: 15/711,808

(22) Filed: Sep. 21, 2017

(65) Prior Publication Data
US 2019/0084222 A1    Mar. 21, 2019

(51) Int. Cl.
*B29C 64/135*    (2017.01)
*B22F 3/105*    (2006.01)
(Continued)

(52) U.S. Cl.
CPC ............ *B29C 64/135* (2017.08); *B22F 3/004* (2013.01); *B22F 3/1055* (2013.01);
(Continued)

(58) Field of Classification Search
CPC .................. B23K 26/342; B23K 15/0086; B23K 26/082; B22F 3/1055; B22F 2003/1052;
(Continued)

(56) References Cited

U.S. PATENT DOCUMENTS

| 4,863,538 A | 9/1989 | Deckard |
| 5,038,014 A * | 8/1991 | Pratt ..................... B22F 3/1055 |
| | | 219/121.64 |

(Continued)

FOREIGN PATENT DOCUMENTS

| CN | 101835554 A | 9/2010 |
| CN | 106041079 A | 10/2016 |

(Continued)

OTHER PUBLICATIONS

European Search Report Corresponding to Application No. 18192524 dated Jan. 14, 2019.

(Continued)

*Primary Examiner* — Dana Ross
*Assistant Examiner* — Ket D Dang
(74) *Attorney, Agent, or Firm* — Dority & Manning, P.A.

(57) ABSTRACT

A method, apparatus, and program for additive manufacturing. In one aspect, the method and program comprises forming an at least partially solidified portion within a first scan region by irradiating a build material at a first energy density value along a first irradiation path. A second at least partially solidified portion is formed within a second scan region that is spaced with respect to the first scan region, wherein the solidified portion within the first scan region is formed by irradiation a build material at a second energy density value along a second irradiation path. The space between the first scan region and the second scan region is at least partially solidified by irradiating a build material at a third energy density value that less than the first energy density value and the second energy density value.

21 Claims, 7 Drawing Sheets

(51) Int. Cl.

| | |
|---|---|
| *B33Y 50/02* | (2015.01) |
| *B23K 26/082* | (2014.01) |
| *B22F 3/00* | (2021.01) |
| *G03F 7/00* | (2006.01) |
| *B33Y 50/00* | (2015.01) |
| *B29C 64/386* | (2017.01) |
| *B29C 64/236* | (2017.01) |
| *B29C 64/153* | (2017.01) |
| *B29C 64/264* | (2017.01) |
| *B33Y 10/00* | (2015.01) |
| *B29C 64/241* | (2017.01) |

(52) U.S. Cl.
CPC .......... *B23K 26/082* (2015.10); *B29C 64/153* (2017.08); *B29C 64/236* (2017.08); *B29C 64/241* (2017.08); *B29C 64/264* (2017.08); *B29C 64/386* (2017.08); *B33Y 10/00* (2014.12); *B33Y 50/00* (2014.12); *B33Y 50/02* (2014.12); *G03F 7/0037* (2013.01); *B22F 2003/1052* (2013.01); *B22F 2003/1056* (2013.01); *B22F 2003/1057* (2013.01); *G05B 2219/49013* (2013.01)

(58) Field of Classification Search
CPC ...... B22F 2003/1056; B22F 2003/1057; B22F 3/004; B29C 64/135; B29C 64/153; B29C 64/236; B29C 64/241; B29C 64/264; B29C 64/386; B33Y 10/00; B33Y 50/00; B33Y 50/02; G03F 7/0037; G05B 2219/39013; Y02P 10/25
USPC .......................................... 219/121.64, 121.14
See application file for complete search history.

(56) References Cited

U.S. PATENT DOCUMENTS

| | | | |
|---|---|---|---|
| 5,460,758 A | 10/1995 | Langer et al. | |
| 6,508,971 B2* | 1/2003 | Leyden | B29C 41/12 264/401 |
| 6,596,224 B1* | 7/2003 | Sachs | B22F 3/008 419/6 |
| 6,646,728 B1 | 11/2003 | Tang et al. | |
| 6,730,256 B1 | 5/2004 | Bloomstein et al. | |
| 6,872,912 B1* | 3/2005 | Wos | B23K 26/18 219/121.64 |
| 7,713,454 B2 | 5/2010 | Larsson | |
| 7,731,887 B2 | 6/2010 | Hull et al. | |
| 8,034,279 B2 | 10/2011 | Dimter et al. | |
| 8,075,719 B2 | 12/2011 | Laurent et al. | |
| 8,175,734 B2 | 5/2012 | Fogel et al. | |
| 8,461,474 B2* | 6/2013 | Wollenhaupt | B23K 15/0086 219/121.14 |
| 9,126,287 B2* | 9/2015 | Bruck | B23K 9/042 |
| 9,138,807 B1* | 9/2015 | Takezawa | B22F 3/1055 |
| 9,138,897 B1 | 9/2015 | Salisbury et al. | |
| 9,268,568 B2 | 2/2016 | Guok et al. | |
| 9,533,372 B2 | 1/2017 | O'Neill | |
| 9,878,497 B2 | 1/2018 | Schwarze et al. | |
| 10,124,408 B2 | 11/2018 | Kenney et al. | |
| 2008/0199344 A1* | 8/2008 | Chau | B23K 26/0661 419/8 |
| 2011/0226390 A1* | 9/2011 | Chen | C22C 19/00 148/527 |
| 2011/0275193 A1* | 11/2011 | Brunton | H01L 31/18 438/463 |
| 2014/0088750 A1 | 3/2014 | Sharma et al. | |
| 2016/0167160 A1 | 6/2016 | Hellestam | |
| 2016/0318129 A1* | 11/2016 | Hu | B29C 64/182 |
| 2017/0085733 A1 | 3/2017 | Ilic et al. | |

FOREIGN PATENT DOCUMENTS

| | | |
|---|---|---|
| EP | 2875897 B1 | 1/2016 |
| EP | 3248715 A1 | 11/2017 |
| JP | 2008/155538 A | 7/2008 |
| JP | 2015/128898 A | 7/2015 |
| JP | 2015/199195 A | 11/2015 |
| JP | 2016/502596 A | 1/2016 |
| JP | 2016/527386 A | 9/2016 |
| WO | WO2013/070217 A1 | 5/2013 |
| WO | WO2016/096438 A1 | 6/2016 |

OTHER PUBLICATIONS

European Search Opinion Corresponding to Application No. 18192524.9 dated Jan. 22, 2019.
Carter et al, the Influence of the Laser Scan Strategy on Grain Structure and Cracking Behaviour in SLM Powder-Bed Fabricated Nickel Superalloy, Journal of Alloys and Compounds, vol. 615, Dec. 2014, pp. 338-347.
Combined Chinese Search Report and Office Action Corresponding to Application No. 201811116906 dated Jul. 2, 2020.
Machine Translated Japanese Office Action Corresponding to Application No. 2018167438 dated Nov. 18, 2019.

* cited by examiner

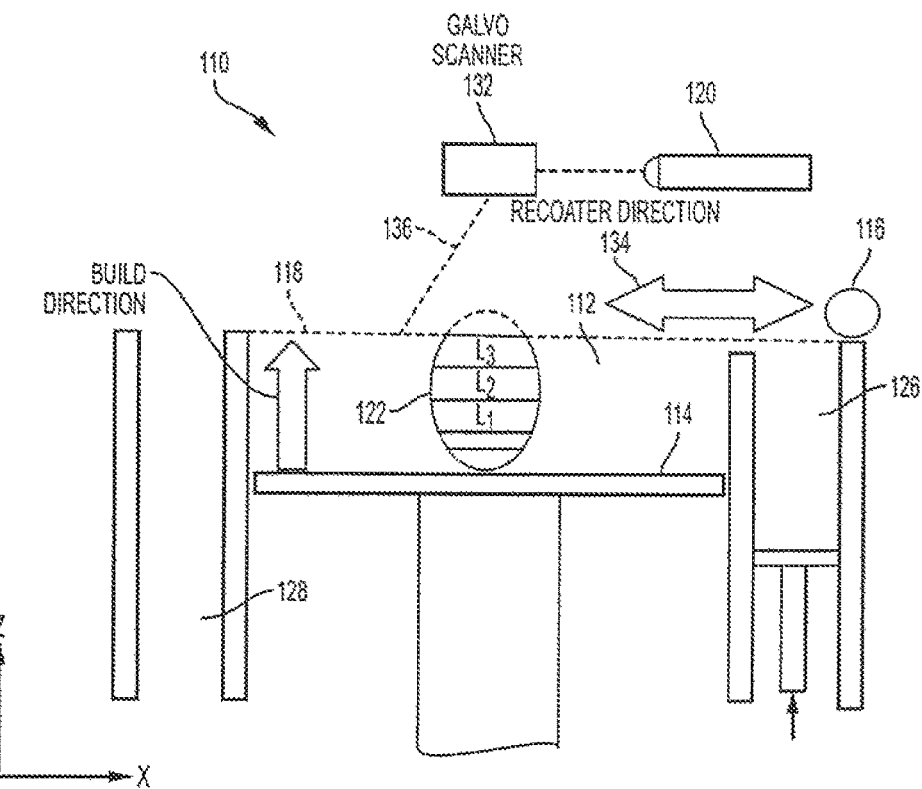
FIG. 1
PRIOR ART
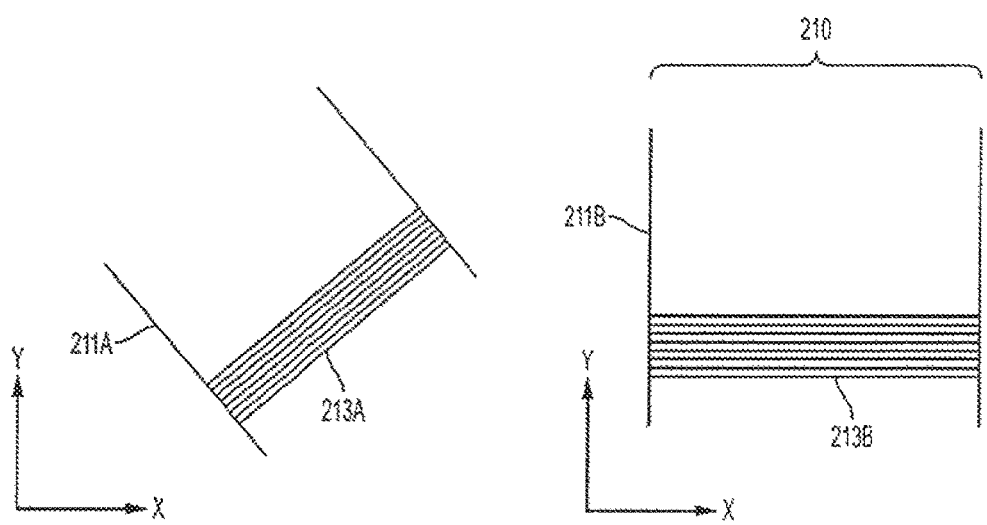
FIG. 2
PRIOR ART
FIG. 3
PRIOR ART

SCANNING STRATEGY FOR PERIMETER AND REGION ISOLATION

TECHNICAL FIELD

The disclosure relates to an improved method and apparatus for region specific process parameters for use in additive manufacturing.

BACKGROUND

Additive manufacturing (AM) techniques may include electron beam freeform fabrication, laser metal deposition (LMD), laser wire metal deposition (LMD-w), gas metal arc-welding, laser engineered net shaping (LENS), laser sintering (SLS), direct metal laser sintering (DMLS), electron beam melting (EBM), powder-fed directed-energy deposition (DED), and three dimensional printing (3DP), as examples. AM processes generally involve the buildup of one or more materials to make a net or near net shape (NNS) object in contrast to subtractive manufacturing methods. Though "additive manufacturing" is an industry standard term (ASTM F2792), AM encompasses various manufacturing and prototyping techniques known under a variety of names, including freeform fabrication, 3D printing, rapid prototyping/tooling, etc. AM techniques are capable of fabricating complex components from a wide variety of materials. Generally, a freestanding object can be fabricated from a computer aided design (CAD) model. As an example, a particular type of AM process uses an energy beam, for example, an electron beam or electromagnetic radiation such as a laser beam, to sinter or melt a powder material and/or wire-stock, creating a solid three-dimensional object in which a material is bonded together.

Selective laser sintering, direct laser sintering, selective laser melting, and direct laser melting are common industry terms used to refer to producing three-dimensional (3D) objects by using a laser beam to sinter or melt a fine powder. For example, U.S. Pat. Nos. 4,863,538 and 5,460,758 describe conventional laser sintering techniques. More specifically, sintering entails fusing (agglomerating) particles of a powder at a temperature below the melting point of the powder material, whereas melting entails fully melting particles of a powder to form a solid homogeneous mass. The physical processes associated with laser sintering or laser melting include heat transfer to a powder material and then either sintering or melting the powder material. Electron beam melting (EBM) utilizes a focused electron beam to melt powder. These processes involve melting layers of powder successively to build an object in a metal powder.

AM techniques, examples of which are discussed above and throughout the disclosure, may be characterized by using a laser or an energy source to generate heat in the powder to at least partially melt the material. Accordingly, high concentrations of heat are generated in the fine powder over a short period of time. The high temperature gradients within the powder during buildup of the component may have a significant impact on the microstructure of the completed component. Rapid heating and solidification may cause high thermal stress and cause localized non-equilibrium phases throughout the solidified material. Further, since the orientation of the grains in a completed AM component may be controlled by the direction of heat conduction in the material, the scanning strategy of the laser in an AM apparatus and technique becomes an important method of controlling microstructure of the AM built component. Controlling the scanning strategy in an AM apparatus is further crucial for developing a component free of material defects, examples of defects may include lack of fusion porosity and/or boiling porosity.

FIG. 1 is schematic diagram showing a cross-sectional view of an exemplary conventional system 110 for direct metal laser sintering (DMLS) or direct metal laser melting (DMLM). The apparatus 110 builds objects, for example, the part 122, in a layer-by-layer manner (e.g. layers L1, L2, and L3, which are exaggerated in scale for illustration purposes) by sintering or melting a powder material (not shown) using an energy beam 136 generated by a source such as a laser 120. The powder to be melted by the energy beam is supplied by reservoir 126 and spread evenly over a build plate 114 using a recoater arm 116 travelling in direction 134 to maintain the powder at a level 118 and remove excess powder material extending above the powder level 118 to waste container 128. The energy beam 136 sinters or melts a cross sectional layer (e.g. layer L1) of the object being built under control of the galvo scanner 132. The build plate 114 is lowered and another layer (e.g. layer L2) of powder is spread over the build plate and object being built, followed by successive melting/sintering of the powder by the laser 120. The process is repeated until the part 122 is completely built up from the melted/sintered powder material. The laser 120 may be controlled by a computer system including a processor and a memory. The computer system may determine a scan pattern for each layer and control laser 120 to irradiate the powder material according to the scan pattern. After fabrication of the part 122 is complete, various post-processing procedures may be applied to the part 122. Post processing procedures include removal of excess powder, for example, by blowing or vacuuming, machining, sanding or media blasting. Further, conventional post processing may involve removal of the part 122 from the build platform/substrate through machining, for example. Other post processing procedures include a stress release process. Additionally, thermal and chemical post processing procedures can be used to finish the part 122.

The abovementioned AM processes is controlled by a computer executing a control program. For example, the apparatus 110 includes a processor (e.g., a microprocessor) executing firmware, an operating system, or other software that provides an interface between the apparatus 110 and an operator. The computer receives, as input, a three dimensional model of the object to be formed. For example, the three dimensional model is generated using a computer aided design (CAD) program. The computer analyzes the model and proposes a tool path for each object within the model. The operator may define or adjust various parameters of the scan pattern such as power, speed, and spacing, but generally does not program the tool path directly. One having ordinary skill in the art would fully appreciate the abovementioned control program may be applicable to any of the abovementioned AM processes. Further, the abovementioned computer control may be applicable to any subtractive manufacturing or any pre or post processing techniques employed in any post processing or hybrid process.

The above additive manufacturing techniques may be used to form a component from stainless steel, aluminum, titanium, Inconel 625, Inconel 718, Inconel 188, cobalt chrome, among other metal materials or any alloy. For example, the above alloys may include materials with trade names, Haynes 188°, Haynes 625®, Super Alloy Inconel 625™ Chronin® 625, Altemp® 625, Nickelvac® 625, Nicrofer® 6020, Inconel 188, and any other material having material properties attractive for the formation of components using the abovementioned techniques.

In the abovementioned example, a laser and/or energy source is generally controlled to form a series of solidification lines (hereinafter interchangeably referred to as hatch lines, solidification lines and raster lines) in a layer of powder based on a pattern. A pattern may be selected to decrease build time, to improve or control the material properties of the solidified material, to reduce stresses in the completed material, and/or to reduce wear on the laser, and/or galvanometer scanner and/or electron-beam. Various scanning strategies have been contemplated in the past, and include, for example, chessboard patters and/or stripe patterns.

One attempt at controlling the stresses within the material of the built AM component involves the rotation of stripe regions containing a plurality of adjoining parallel vectors, as solidification lines, that run perpendicular to solidification lines forming the boundaries of the stripe region. for each layer during an AM build process. Parallel solidification lines, bounded by and perpendicular to a stripe, are rotated for each layer of the AM build. One example of controlling the scanning strategy in an AM apparatus is disclosed in U.S. Pat. No. 8,034,279 B2 to Dimter et al., titled "Method and Device for Manufacturing a Three-dimensional Object," which is hereby incorporated by reference in its entirety.

FIGS. 2 and 3 represent the abovementioned rotating stripe strategy. The laser is scanned across the surface of a powder to form a series of solidification lines 213A, 213B. The series of solidification lines form a layer of the build and are bound by solidification lines in the form of stripes 211A, 212A and 211B, 212B that are perpendicular to the solidification lines 213A and 213B forming the boundaries of each stripe region. The stripe regions bounded by solidification lines 211A and 212A form a portion of a larger surface of the layer to be built. In forming a part, a bulk of the part cross section is divided into numerous stripe regions (regions between two solidified stripes containing transverse solidification lines). A stripe orientation is rotated for each layer formed during the AM build process as shown in FIGS. 2 and 3. A first layer may be formed with a series of parallel solidification lines 213A, in a stripe region, formed substantially perpendicular to and bounded by solidified stripes 211A. In a subsequent layer formed over the first layer, the stripes 211B are rotated as shown in FIG. 3. By creating a stripe boundary for the solidified lines 213A and 213B through a set of solidified stripes 211B and 212B that are rotated with respect to the previous layer, solidification lines 213B, which are be formed perpendicular to and are bounded by stripes 211B are also be rotated with respect the solidification lines 213A of the previous layer.

Using the abovementioned rotating stripe strategy, the need exists to further create variance in each layer. By employing the various embodiments disclosed, build efficiency can be further increased by preventing unnecessary jumps of the energy source, preventing unnecessary on/off transitions of the laser and/or improving control and/or efficiency of heat buildup within the layer. Further the microstructure of the part can be altered by controlling the pattern of stripe regions and solidification lines within the stripe region.

However, there in a AM apparatus employing the abovementioned strategies there exists a further need to control the energy density between stripe regions and/or at a boundary between two regions formed using the abovementioned stripe and solidification line scheme and/or when a single series of solidification lines are used.

SUMMARY OF THE INVENTION

In one aspect, A method for additive manufacturing is disclosed. The method comprises forming an at least partially solidified portion within a first scan region by irradiating a build material at a first energy density value along a first irradiation path. A second at least partially solidified portion is formed within a second scan region that is spaced with respect to the first scan region, wherein the solidified portion within the first scan region is formed by irradiation a build material at a second energy density value along a second irradiation path. The space between the first scan region and the second scan region is at least partially solidified by irradiating a build material at a third energy density value that less than the first energy density value and the second energy density value. The solidified portion within the first scan region may be formed when a build unit is at a first location with respect to the component, and the solidified portion within the second scan region may be formed when the build unit is at a second location different from the first location.

In one aspect, the first and second scan regions may be located on a mobile build platform. The solidified portion within the first scan region may be formed when the mobile build platform is in a first location with respect to a build unit and the solidified portion within the second scan region may be formed when the mobile build platform is in a second location with respect to the build unit.

In the above aspects, the energy density value may be altered by changing at least one of an electron beam power, laser power, a scan speed, and a scan spacing.

In another aspect, a non-transitory computer readable medium storing a program configured to cause a computer to execute an additive manufacturing method is disclosed. The additive manufacturing method may include forming an at least partially solidified portion within a first scan region, wherein the solidified portion within the first scan region is formed by irradiating a build material at a first energy density value along a first irradiation path. Further an at least partially solidified portion within a second scan region that is spaced with respect to the first scan region may be formed. The solidified portion within the first scan region may be formed by irradiation a build material at a second energy density value along a second irradiation path. The space between the first scan region and the second scan region may be at least partially solidified by irradiating a build material at a third energy density value that less than the first energy density value and the second energy density value.

In one aspect, the first and second scan regions may be located on a mobile build platform. The solidified portion within the first scan region may be formed when the mobile build platform is in a first location with respect to a build unit and the solidified portion within the second scan region may be formed when the mobile build platform is in a second location with respect to the build unit.

In the above aspects, the energy density value may be altered by changing at least one of an electron beam power, laser power, a scan speed, and a scan spacing.

BRIEF DESCRIPTION OF THE DRAWINGS

The accompanying drawings, which are incorporated into and constitute a part of this specification, illustrate one or more example aspects of the present disclosure and, together with the detailed description, serve to explain their principles and implementations.

FIG. 1 is a side view diagram of a conventional additive manufacturing technique used to form at least part of a component;

FIG. 2 is a top view depicting a conventional hatch and stripe pattern used to form at least a part of a component;

FIG. 3 is a top view depicting a conventional hatch and stripe pattern used to form at least a part of a component;

DETAILED DESCRIPTION

While the aspects described herein have been described in conjunction with the example aspects outlined above, various alternatives, modifications, variations, improvements, and/or substantial equivalents, whether known or that are or may be presently unforeseen, may become apparent to those having at least ordinary skill in the art. Accordingly, the example aspects, as set forth above, are intended to be illustrative, not limiting. Various changes may be made without departing from the spirit and scope of the disclosure. Therefore, the disclosure is intended to embrace all known or later-developed alternatives, modifications, variations, improvements, and/or substantial equivalents.

When using any of the abovementioned AM techniques to form a part by at least partially melting a powder, a scan of the laser across the powder material, in a raster scan fashion is used to create hatch scans (hereinafter referred to interchangeably as hatch scans, rasters, scan lines, or solidification lines). During an AM build, the abovementioned solidification lines are used to form the bulk of a part cross section. Contour scans, may further be used to outline the edges of the part cross section. During a raster scan process, the energy source or laser is turned on, increased in power and/or focused in regions where a solid portion of the AM build is desired, and switched off, defocused, pulsed, and/or decreased in power where melt formation of the object's cross section in that layer are not desired. During a raster scan process, at least partially melting of powder and formation of solidification is repeated along adjacent solidification lines, for example, to form a single melted and fused cross section of the object to be built, while the contour scans create a discrete border or edge of the part. In the example AM apparatus using a powder bed, once the melt formation of one cross section of the object being built is completed, the apparatus coats the completed cross-sectional surface with an additional layer of powder. The process is repeated until the object is complete.

For the above reasons, the laser and/or energy source is controlled to form a series of solidification lines in a layer of powder using a pattern for at least the following reasons; to decrease build time, to control the heat buildup within the powder and/or to increase the efficiency of the build, to improve and/or control the material properties of the solidified material, to reduce stresses in the completed material, and/or to reduce wear on the laser and/or galvanometer scanner.

Figure 4:
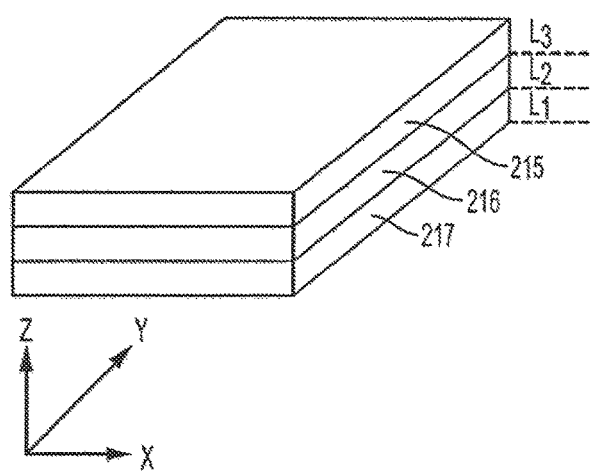
FIG. 4 is a perspective view, depicting example layers of component build during a conventional AM process.
Figure 5:
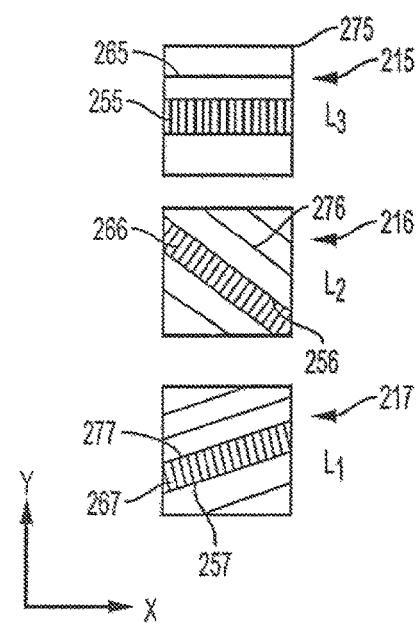
FIG. 5 is a top view depicting a hatch and stripe pattern used to form each layer of the component depicted in FIG. 4.

As shown in FIGS. 4 and 5, a built AM component includes a plurality of layers 215, 216, 217. One example of the abovementioned strategy is shown, for example, a first layer 217 may be divided by software into several stripe regions bounded by, stripes 257 and 277 formed as solidification lines. The stripes 257 and 277 may form a boundary for individually formed parallel adjoining vectors or solidification lines 267. The surface of the part includes a plurality of stripes covering the surface to be built. As shown in FIG. 5, each stripe region is bounded by solidified stripes 257 and 277 in layer 217 form a boundary for a series of parallel solidified lines 267. The parallel solidification lines 267 are perpendicular to the solidified stripe boundaries 257 and 277. The stripes are oriented at a first angle in layer 217 with the perpendicular solidification lines 267 being formed substantially perpendicular to the stripes 257 and 277. The stripe region bound by solidified stripes 256 and 257 on a second layer 216 are angled with respect to the solidified stripe boundaries 257 and 277 on previous layer 217. Accordingly, solidification lines 266 that run perpendicular to solidified stripes 256 and 276 are also be angled with respect to the solidification lines 267 on previous layer 217. As the build progresses, a next layer having stripes 265 and 275 on a third layer 215 are angled with respect to stripes 257 and 277 on layer 217; and stripes 256 and 276 on layer 216.

Additional details for scan strategies that can be used in accordance with the present invention may be found in U.S. patent application Ser. No. 15/451,108, titled "Triangle Hatch Pattern for Additive Manufacturing," filed Mar. 7, 2017; U.S. patent application Ser. No. 15/451,043, titled "Leg Elimination Strategy for Hatch Pattern," filed Mar. 6, 2017; U.S. patent application Ser. No. 15/459,941, titled "Constantly Varying Hatch for Additive Manufacturing," filed Mar. 15, 2017, the disclosures of which are incorporated herein by reference.

Figure 6:
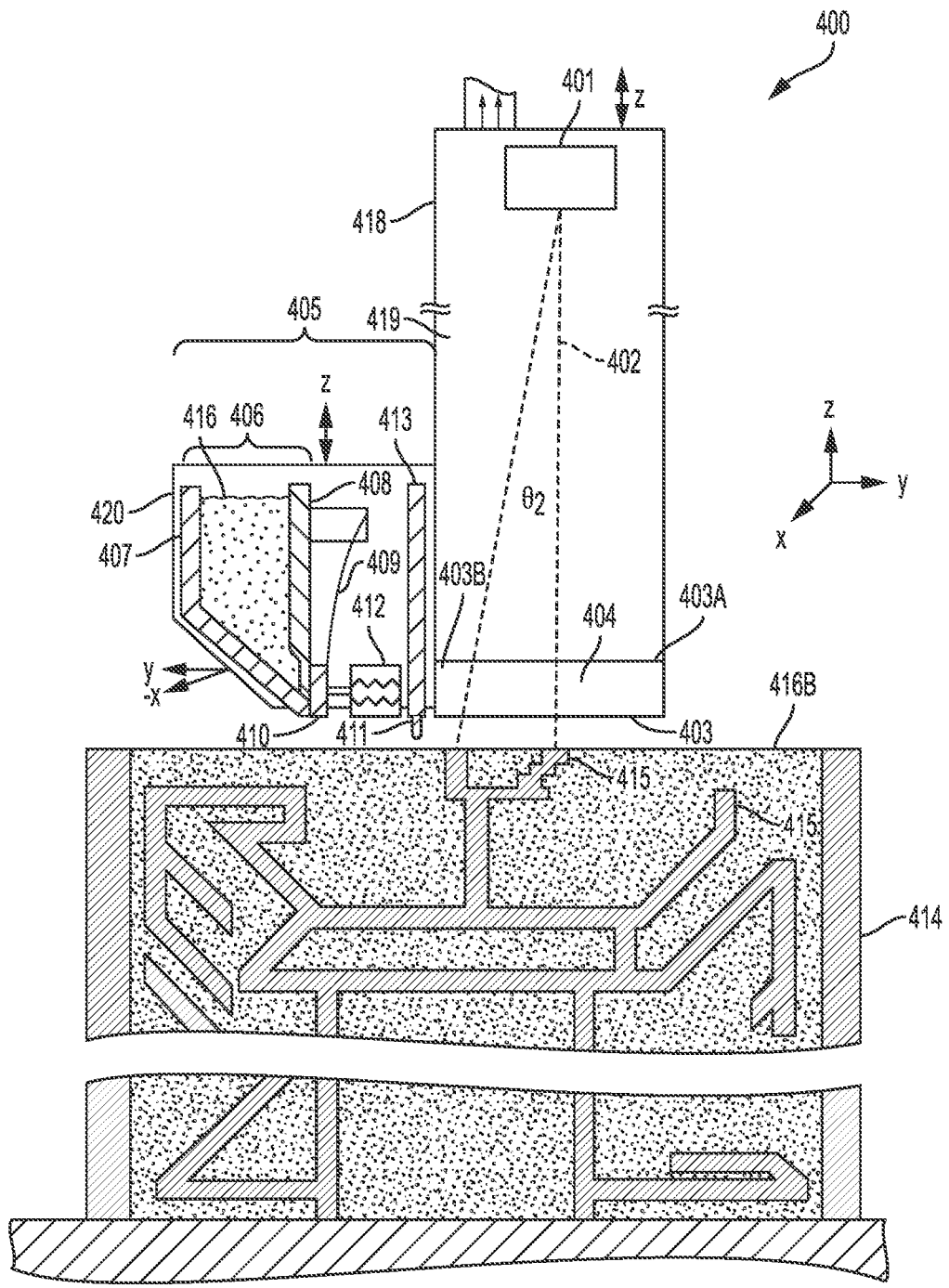
FIG. 6 is a side view cross section of a build unit in accordance with one aspect of the disclosure.

FIG. 6 shows an example of one embodiment of a large-scale AM apparatus according to the present invention. The apparatus comprises a positioning system (not shown), a build unit 400 comprising an irradiation emission directing device 401, a laminar gas flow zone 404, and a build plate (not shown) beneath an object being built 415. The maximum build area is defined by the positioning system (not shown), instead of by a powder bed as with conventional systems, and the build area for a particular build can be confined to a build envelope 414 that may be dynamically built up along with the object. In general, the positioning system used in the present invention may be any multidimensional positioning system such as a gantry system, a delta robot, cable robot, robot arm, etc. The irradiation emission directing device 401 may be independently moved inside of the build unit 400 by a second positioning system (not shown). The atmospheric environment outside the build unit, i.e. the "build environment," or "containment zone," may be controlled such that the oxygen content is reduced relative to typical ambient air, and so that the environment is at reduced pressure. In some embodiments, the recoater used is a selective recoater. One embodiment of a selective recoater 411 is illustrated in FIG. 6.

There may also be an irradiation source that, in the case of a laser source, originates the photons comprising the laser irradiation that is directed by the irradiation emission directing device. When the irradiation source is a laser source, then the irradiation emission directing device may be, for example, a galvo scanner, and the laser source may be located outside the build environment. Under these circumstances, the laser irradiation may be transported to the irradiation emission directing device by any suitable means, for example, a fiber-optic cable. When the irradiation source is an electron source, then the electron source originates the electrons that comprise the e-beam that is directed by the irradiation emission directing device. When the irradiation source is an electron source, then the irradiation emission directing device may be, for example, a deflecting coil. When a large-scale additive manufacturing apparatus according to an embodiment of the present invention is in operation, if the irradiation emission directing devices directs a laser beam, then generally it is advantageous to include a gasflow device 404 providing substantially laminar gas flow zone. An electron-beam may also be used in instead of the laser or in combination with the laser. An e-beam is a well-known source of irradiation. For example, U.S. Pat. No. 7,713,454 to Larsson titled "Arrangement and Method for Producing a Three-Dimensional Product" ("Larsson") discusses e-beam systems, and is incorporated herein by reference.

The gasflow device 404 may provide gas to a pressurized outlet portion (not shown) and a vacuum inlet portion (not shown) which may provide gas flow to a gasflow zone 403, and a recoater 405. Above the gasflow zone 404 there is an enclosure 418 which may contain an inert environment 419. The recoater 405 may include a hopper 406 comprising a back plate 407 and a front plate 408. The recoater 405 also has at least one actuating element 409, at least one gate plate 410, a recoater blade 411, an actuator 412, and a recoater arm 413. The recoater is mounted to a mounting plate 420. FIG. 6 also shows a build envelope 414 that may be built by, for example, additive manufacturing or Mig/Tig welding, an object being formed 415, and powder 416 contained in the hopper 405 used to form the object 415. In this particular example, the actuator 412 activates the actuating element 409 to pull the gate plate 410 away from the front plate 408. In an embodiment, the actuator 412 may be, for example, a pneumatic actuator, and the actuating element 409 may be a bidirectional valve. In an embodiment, the actuator 412 may be, for example, a voice coil, and the actuating element 409 may be a spring. There is also a hopper gap 417 between the front plate 408 and the back plate 407 that allows powder to flow when a corresponding gate plate is pulled away from the powder gate by an actuating element. The powder 416, the back plate 407, the front plate 408, and the gate plate 410 may all be the same material. Alternatively, the back plate 407, the front plate 408, and the gate plate 410 may all be the same material, and that material may be one that is compatible with any desired material, such as cobalt-chrome for example. In this particular illustration of one embodiment of the present invention, the gas flow in the gasflow zone 404 flows in the x direction, but could also flow in any desired direction with respect to the build unit. The recoater blade 411 has a width in the x direction. The direction of the irradiation emission beam when $\theta_2$ is approximately 0 defines the z direction in this view. The gas flow in the gasflow zone 404 may be substantially laminar. The irradiation emission directing device 401 may be independently movable by a second positioning system (not shown). This illustration shows the gate plate 410 in the closed position.

Further it is noted that while the abovementioned selective powder recoating mechanism 405 only includes a single powder dispenser, the powder recoating mechanism may include multiple compartments containing multiple different material powders are also possible. Similarly, the abovementioned apparatus may include plurality of recoater mechanisms.

When the gate plate 410 in the open position, powder in the hopper is deposited to make fresh powder layer 521, which is smoothed over by the recoater blade 511 to make a substantially even powder layer. In some embodiments of the present invention, the substantially even powder layer may be irradiated at the same time that the build unit is moving, which would allow for continuous operation of the build unit and thus faster production of the object.

Figure 7:
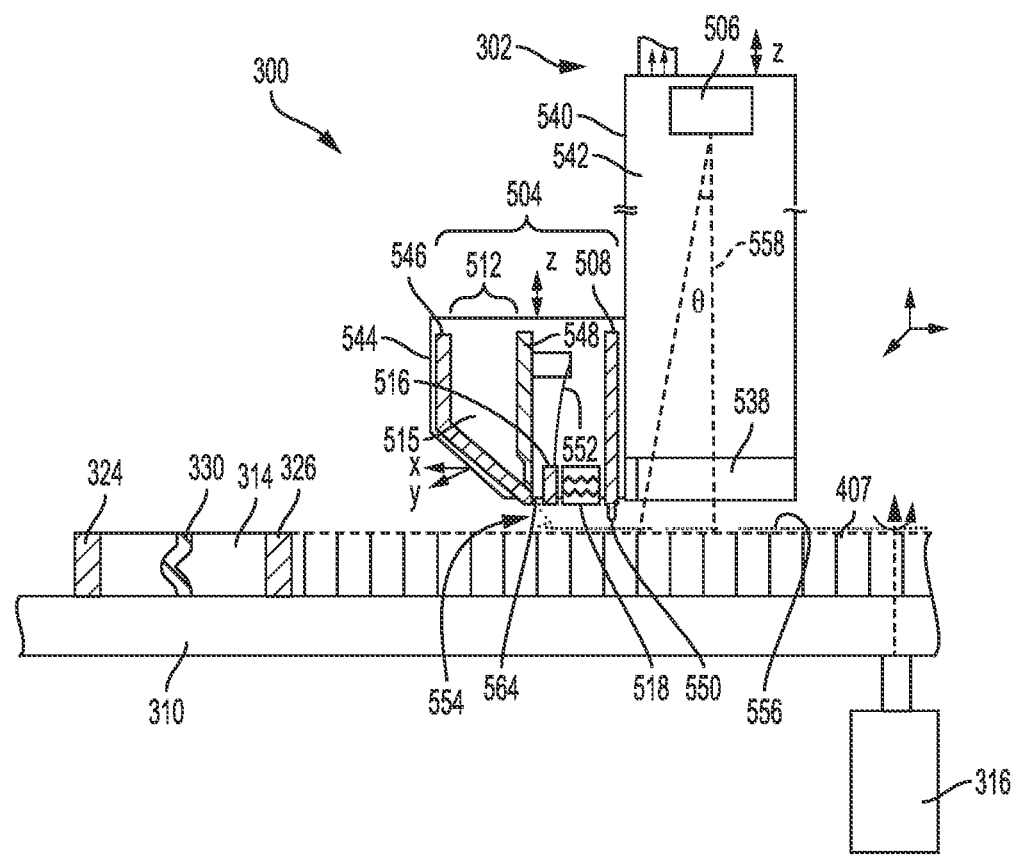
FIG. 7 is a side view cross section of a build unit and part of the rotating build platform of an additive manufacturing apparatus in accordance with one aspect of the disclosure.

FIG. 7 shows a side view of a manufacturing apparatus 300 including details of the build unit 302, which is pictured on the far side of the build platform. The mobile build unit 302 includes an irradiation beam directing mechanism 506, a gas-flow mechanism 532 with a gas inlet and gas outlet (not shown) providing gas flow to a gas flow zone in direction 538, and a powder recoating mechanism 504. In this example, the flow direction is substantially along the X direction. Above the gas flow zone 538, there may be an enclosure 540 that contains an inert environment 542. The powder recoating mechanism 504, which is mounted on a recoater plate 544, has a powder dispenser 512 that includes a back plate 546 and a front plate 548. The powder recoating mechanism 504 also includes at least one actuating element 552, at least one gate plate 516, a recoater blade 550, an actuator 518 and a recoater arm 508. In this embodiment, the actuator 518 activates the actuating element 552 to pull the gate plate 516 away from the front plate 548, as shown in FIG. 7. There is also a gap 564 between the front plate 548 and the gate plate 516 that allows the powder to flow onto the rotating build platform 310 when the gate plate 516 is pulled away from the front plate 548 by the actuating element 552. The rotating build platform 310 may be rotatably controlled by a motor 316.

FIG. 7 shows a build unit 302 with the gate plate 516 at an open position. The powder 515 in the powder dispenser 512 is deposited to make a fresh layer of powder 554, which is smoothed over a portion of the top surface (i.e. build or work surface) of the rotating build platform 310 by the recoater blade 510 to make a substantially even powder layer 556 which is then irradiated by the irradiation beam 558 to a fused layer that is part of the printed object 330. In some embodiments, the substantially even powder layer 556 may be irradiated at the same time as the build unit 302 is moving, which allows for a continuous operation of the build unit 302 and hence, a more time-efficient production of the printed or grown object 330. The object being built 330 on the rotating build platform 310 is shown in a powder bed 314 constrained by an outer build wall 324 and an inner build wall 326. In this particular illustration of one embodiment of the present invention, the gas flow in the gasflow zone 532 flows in the x direction, but could also flow in any desired direction with respect to the build unit.

It is noted that while the abovementioned selective powder recoating mechanism 504 only includes a single powder dispenser, the powder recoating mechanism may include multiple compartments containing multiple different material powders are also possible. Further, while a single recoater apparatus is shown, the invention is applicable to an apparatus having a plurality of recoater apparatuses.

Additional details for a build units and positioning mechanisms for a single and/or multiple units that can be used in accordance with the present invention may be found in U.S. patent application Ser. No. 15/610,177, titled "Additive Manufacturing Using a Mobile Build Volume," filed May 31, 2017; U.S. patent application Ser. No. 15/609,965, titled "Apparatus and Method for Continuous Additive Manufacturing," filed May 31, 2017; U.S. patent application Ser. No. 15/610,113, titled "Method for Real-Time Simultaneous Additive and Subtractive Manufacturing With a Dynamically Grown Build Wall," filed May 31, 2017; U.S. patent application Ser. No. 15/610,214, titled "Method for Real-Time Simultaneous and Calibrated Additive and Subtractive Manufacturing," filed May 31, 2017; U.S. patent application Ser. No. 15/609,747, titled "Apparatus and Method for Real-Time Simultaneous Additive and Subtractive Manufacturing with Mechanism to Recover Unused Raw Material," filed May 31, 2017; U.S. patent application Ser. No. 15/406,444, titled "Additive Manufacturing Using a Dynamically Grown Build Envelope," filed Jan. 13, 2017; U.S. patent application Ser. No. 15/406,467, titled "Additive Manufacturing Using a Mobile Build Volume," filed Jan. 13, 2017; U.S. patent application Ser. No. 15/406,454, titled "Additive Manufacturing Using a Mobile Scan Area," filed Jan. 13, 2017; U.S. patent application Ser. No. 15/406,461, titled "Additive Manufacturing Using a Selective Recoater," filed Jan. 13, 2017; U.S. patent application Ser. No. 15/406,471, titled "Large Scale Additive Machine," filed Jan. 13, 2017, the disclosures of which are incorporated herein by reference.

Figure 8A:
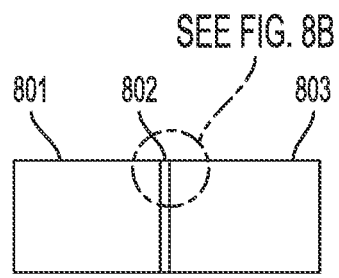
FIG. 8A is a top view showing an example of a region between two adjacent scan zones in accordance with one aspect of the disclosure.
Figure 8B:
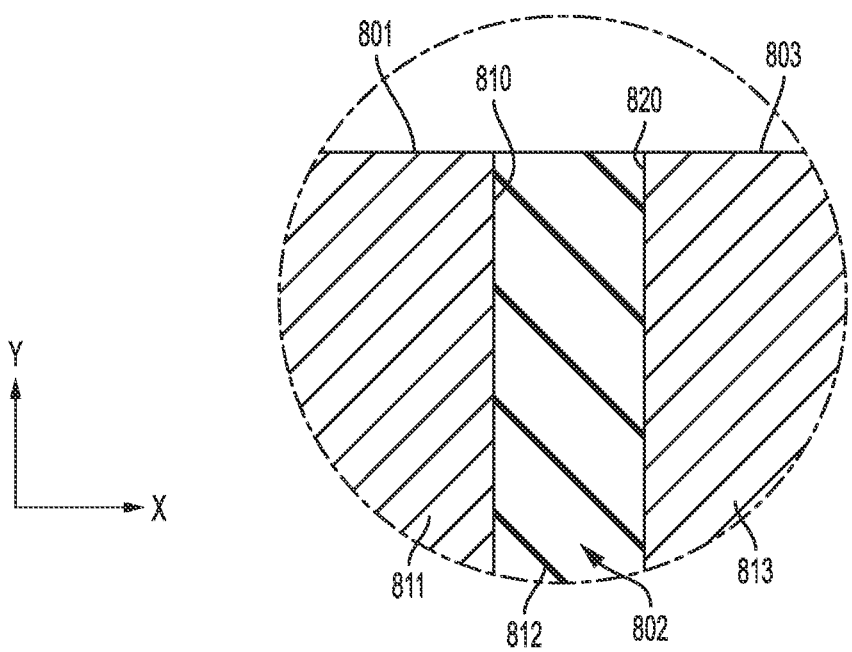
FIG. 8B is a magnified view of FIG. 8A showing an example of a region between two adjacent scan zones in accordance with one aspect of the disclosure.

As mentioned above, a build unit (e.g. as shown in FIGS. 6 and 7) is used to selectively provide a build material (e.g. powder) and at least partially melt or sinter the build material within a scan region. As the size of the component being manufactured using the AM apparatus increases, portions of the component may require a build unit to move to another scan zone. Further, portions of the build may require two or more scan zones to be connected to form a single larger at least partially solidified layer of the AM build. For example, as shown in FIGS. 8A-B, a first scan zone 801 may be near a second scan zone 803. The first scan zone may represent a portion of a scan-able region at a first location of the build unit (e.g. build units 302 and/or 400 as shown in FIGS. 6 and 7) and/or may represent a first position of the build platform 310 shown in FIG. 7 with respect to the build unit 302, for example. A second scan zone 803 may represent a portion of a scan-able region at a second location of the build unit (e.g. build units 302 and/or 400 as shown in FIGS. 6 and 7) and or may represent a second position of the build platform 310 shown in FIG. 7 with respect to the build unit 302, for example. When forming a layer of the AM build by at least partially solidifying a build material in scan zone 801 and/or 802, excessive heat build-up may occur at a space 802 between the first scan region 801 and the second scan region 802.

A scan-able region may represent a surface area over which the irradiation source is capable of at least partially fusing a build material at a specific location of the build unit. For example, with reference to FIG. 6, a scan-able region may include a surface area of the powder 416B and/or fused region 415 over which the irradiation source 402 is capable of operating (e.g. capable of fusing and/or sintering the build material) while the build unit 400 is in a single orientation with respect to the build surface 415 and/or 416B. In other words regions 801 and 803, may represent a surface that is at least a portion of a total scan-able region while a build unit and/or platform is in a single stationary orientation.

As shown in FIGS. 8A-B, each of the scan regions 801 and/or 803 may be selected by software which divides each layer of a desire AM build into build unit positions and raster-scan regions. Each scan region 801 and/or 803 may include solidification lines 811 and/or 803 which may be bounded by a stripe 810 and/or 820. As mentioned above each stripe may be a separate solidification line or may simply represent a border for each of the solidification lines 811 and/or 813. If the stripes 810 and/or 820 are borders an irradiation source may follow a path along a build material to form each solidification line 811 and/or 813 and may be defocused, pulsed, decreased in power, and/or turned off at the stripe 810 and/or 820.

As mentioned above, when forming a layer of the AM build by at least partially solidifying a build material in scan zone 801 and/or 802, excessive heat build-up and/or decreased temperature may occur at various regions of space 802 between the first scan region 801 and the second scan region 802. In order to compensate for excessive heat build-up in space 802, the process parameters may be adjusted to assure that the layer being built has the desired properties. For example, solidification lines 812 may be formed with different process parameters than solidification lines 811 and 813 to compensate for any excessive heat build-up within space 802.

One of the process parameters which may be controlled during an AM build process is energy imparted into the build material. For example, when using a laser, a laser energy imparted into the build material is derived from the laser power, the scan speed, and the scan spacing. The laser power, is energy directed into the built part (e.g. the build material and the component being built) as opposed to the wattage input into the laser. Thus, the laser power may comprise a focus of the laser, a pulse of the laser, and/or wattage of the laser. Scan speed is the velocity at which the laser moves across the build profile. The scan speed may be determined by the velocity at which galvanometer scanner directs the laser, for example. Scan spacing is the spacing between each solidification line formed in the build material. Any of the abovementioned process parameters may be controlled to impart a specific energy into the build material. Thus, while not limited as such, an energy density may be controlled by controlling any one of or a combination of the abovementioned values.

Excessive energy densities during a build process could result in warping, dimensional inaccuracies, and/or boiling porosity in the finished component. Energy densities that are too low could result in improper bonding of the completed component. Thus, throughout the build the energy density may be constantly controlled based on an estimated or detected energy density build up and/or decrease in energy density within a region of the build. Any of the abovementioned variables may be altered within a region to assure a consistent build and/or to control the metallurgical properties of the completed layer and/or multiple completed layers.

For example, with reference to FIGS. 8A-B, each of the scan regions 801 and/or 803 may be selected by software which divides each layer of a desire AM build into build unit positions and raster-scan regions. Each scan region 801 and/or 803 may include solidification lines 811 and/or 803 which may be bounded by a stripe 810 and/or 820, the solidification lines 801 may be formed by irradiating a powder at a first energy density. As mentioned above each stripe may be a separate solidification line or may simply represent a border for each of the solidification lines 811 and/or 813. If the stripes 810 and/or 820 are borders an irradiation source may follow a path along a build material to form each solidification line 811 and/or 813 and may be defocused, pulsed, decreased in power, and/or turned off at the stripe 810 and/or 820. The second scan region 803 may be irradiated to form solidification lines 813 at a second energy density. The first energy density and second energy density may be the same or may be varied depending on the determined heat build-up within the layer and/or the desired metallurgical properties of the completed component and/or layer. Scan region 801 and scan region 802 may be formed such that a space 802 exists between the scan region 801 and 802. Because residual heat build-up may exist in space 802, forming solidification lines 812 at the same energy density value as the abovementioned first energy density value and/or the second energy density value may result in overheating of the build material within the region. Thus, the energy density in portion 802 may be varied (e.g. lowered) when compared to the first energy density and second energy density. As mentioned above, the energy density may be varied in portion 802 in several ways. For example, to decrease the energy density within portion 812, portion 802 may be irradiated to form solidification lines 812 that have a larger spacing between each solidification line than the solidification lines 811 and 813. As another example, the solidification lines 812 may be formed at a faster speed than solidification lines 811 and 813 in order to decrease the energy density within portion 802. The energy density may also decreased by defocusing and/or pulsing the irradiation source in portion 802, and/or by decreasing the wattage of the irradiation source when scanning portion 802. It is noted that the abovementioned examples can be used exclusively or in combination to control the energy density within portion 802.

Figure 9:
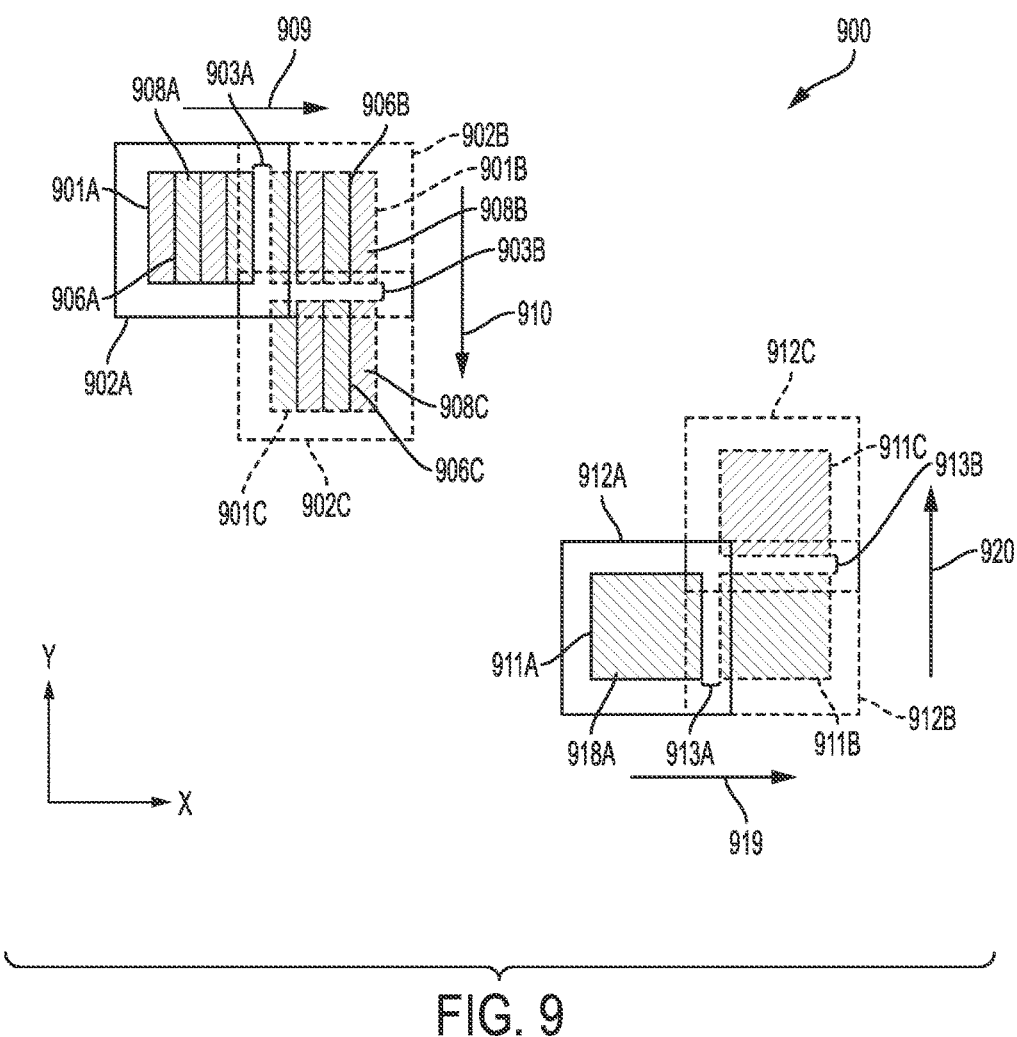
FIG. 9 is a top view depicting example orientations of the build unit and scan zones in accordance with one aspect of the disclosure.

One example implementation is shown in FIG. 9. FIG. 9 represents a top view of a build unit movement within a build area 900. The build area 900 may be a powder bed and/or may be an area supplied with powder by the build unit. A build unit may first be positioned in a first position and/or orientation represented by 902A. It is noted that the outline 902A may represent a scan-able region and/or a build unit outline and is simplified for clarity purposes. Further, it is noted that portion 902A may be referred to interchangeably as a scan-able region or a build unit and may include a larger or smaller area in relation to a scan zone 901A. As mentioned above, the scan zone 901A may be a portion of a scan-able region 902A which may represent a surface area over which the irradiation source is capable of at least partially fusing a build material at a specific location of the build unit e.g. position 902A. For example, with reference to FIG. 6, a scan-able region may include a surface area of the powder 416B and/or fused region 415 over which the irradiation source 402 is capable of operating (e.g. capable of fusing and/or sintering the build material) while the build unit 400 is in a single orientation with respect to the build surface 415 and/or 416B. In other words regions 901A and 901B, may represent a surface that is at least a portion of a total scan-able region while a build unit and/or platform is in a single stationary orientation.

As shown in FIG. 9, first scan zone 901A may be near a second scan zone 901B. The first scan zone may represent a portion of a scan-able region 902A at a first location of the build unit (e.g. build units 302 and/or 400 as shown in FIGS. 6 and 7) and/or may represent a first position of the build platform 310 shown in FIG. 7 with respect to the build unit 302, for example. A second scan zone 901B may represent a portion of a scan-able region 902A at a second location of the build unit (e.g. build units 302 and/or 400 as shown in FIGS. 6 and 7) and or may represent a second position of the build platform 310 shown in FIG. 7 with respect to the build unit 302, for example. The first scan zone may be irradiated to form a series of solidification lines 908A between each stripe 906A. It is noted however, that this example is not limiting, for example, the first scan zone 901A may be formed using any of the abovementioned and incorporated raster scan schemes. Likewise, the second scan zone 902B may be formed by irradiationg the powder along a series of solidification lines 908B bounded by stripes 906A. While not shown in FIG. 9, The stripe and/or solidification line scheme may be varied when forming the first scan zone 901A and the second scan zone 901B. Further, a third scan zone 901C within a third scan-able region 902C may be at least partially solidified by irradiating the build material along a series of solidification lines bounded by stripes 906C. As mentioned above, the stripe and/or solidification line scheme may be varied when forming the first scan zone 901A and the second scan zone 901B and the third scan zone 901C and any combination of solidification line and/or stripe schemes may be used. Further, it is noted that while arrows 909 and 910 show example movements of the build unit, the first, second, and third scan zones may be solidified in any order. When forming a layer of the AM build by at least partially solidifying a build material in scan zone 901A, 901B, and/or 901C, excessive heat build-up may occur at a space 903A and/or 903B between the first, second, and/or third scan regions 901A-C. Accordingly, any of the abovementioned process parameters may be varied when connecting scan regions 901A-C.

For example, to decrease the energy density within portion 903A and/or 903B, portion 903A and/or 903B may be irradiated to form solidification lines (not shown) that have a larger spacing between each solidification line than the solidification lines 908A-B. As another example, the solidification lines in portion 903A and/or 903B may be formed at a faster speed than solidification lines 908A-B in order to decrease the energy density within portion 903A and/or 903B. The energy density may also decreased by defocusing and/or pulsing the irradiation source in portion 903A and/or 903B, and/or by decreasing the wattage of the irradiation source when scanning portion 903A and/or 903B. It is noted that the abovementioned examples can be used exclusively or in combination to control the energy density within portion 903A and/or 903B. Further, portions 903A and/or 903B may be irradiated either before or after formation of the adjoining scan zone. For example, the AM apparatus may be configured to form solidification lines 908A to at least partially solidify the build material within scan zone 901A, after which the build unit may be moved to at least partially solidify the build material within scan zone 901B, after the solidification lines 908A in scan zone 901B are formed the build unit may remain stationary and form the solidification lines in portion 903A at modified process parameters to adjust the energy density of region 903A. As a further example, after portion 903A is at least partially solidified, the build unit may move to the third scan zone 901C to form solidification lines 908C, after which the build unit may remain in the same position and at least partially solidify the region 903B between scan zone 901B and 901C. It is noted that in the abovementioned scenario the process parameter adjustment applied while forming portion 903B may be different than during the formation of 903A because scan zone 906B may have had a greater time to cool off during the at least partial solidification of portion 903A, thus greater energy density may be required when forming portion 903B than 903A.

As another example, scan zones 911A, 911B, and 911C may also be formed at three separate positions of the build unit. Similarly to the scenario above, because of the overlap of each scan-able region 912A-C, portions 913A and/or 903B may be formed by the build while the build unit remains stationary after any single or multiple scan zones are formed that border portions 903A and/or 903B. It is further noted that portions 903A-B and/or 913A-B could be formed by moving the build unit to an intermediate position between each of the scan zones 901A-C and/or 911A-C as well.

It is noted that FIG. 9 shows a limited number of possible positions for simplicity purposes, it each of the abovementioned examples, the build unit may further progress to any position within the build area 900 to at least partially solidify a region and the same inventive principles may be applied. One having ordinary skill in the art would further appreciate that the abovementioned scan zones could be solidified in any desired order and the examples are not limiting. Further, one having skill in the art would further appreciate that the current invention could be applied to various possible AM build scenarios over each layer being formed.

Figure 10:
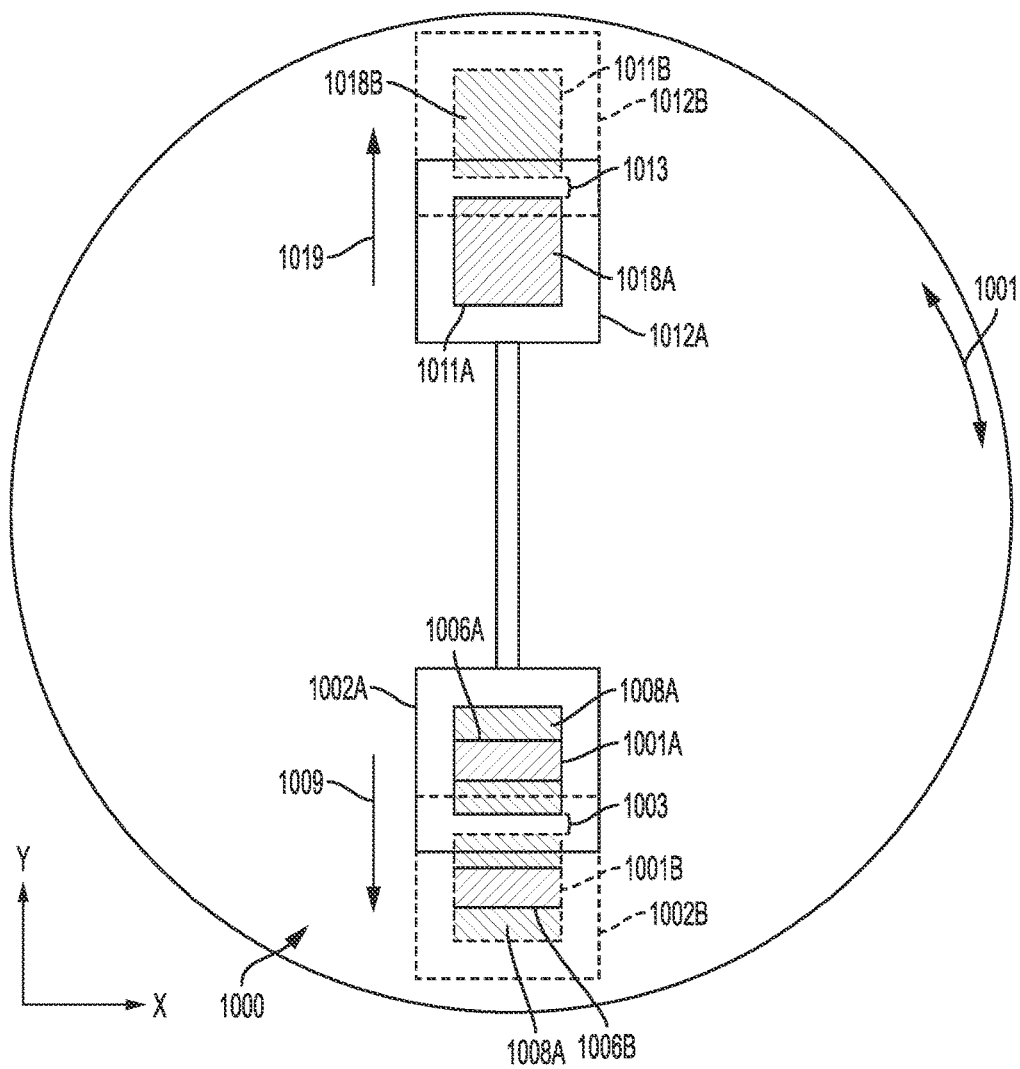
FIG. 10 is a top view depicting example orientations of a build unit and scan zones in accordance with one aspect of the disclosure.

One example implementation is shown in FIG. 10. FIG. 10 represents a top view of a build unit movement within a mobile build area 1000, which may be rotatable along directions shown by arrow 1001. The build area 1000 may be a powder bed and/or may be an area supplied with powder by the build unit. A build unit may first be positioned in a first position and/or orientation represented by 1012A. It is noted that the outline 1012A may represent a scan-able region and/or a build unit outline and is simplified for clarity purposes. Further, it is noted that portion 1012A may be referred to interchangeably as a scan-able region or a build unit and may include a larger or smaller area in relation to a scan zone 1012A. As mentioned above, the scan zone 1012A may be a portion of a scan-able region 1012A which may represent a surface area over which the irradiation source is capable of at least partially fusing a build material at a specific location of the build unit e.g. position 1012A. For example, with reference to FIG. 7, a scan-able region may include a surface area of the powder 330 and/or fused region 330 over which the irradiation source 558 is capable of operating (e.g. capable of fusing and/or sintering the build material) while the build unit 302 is in a single orientation with respect to the build surface 300. In other words regions 1018A and 1018B, may represent a surface that is at least a portion of a total scan-able region 1012A and 1012B while a build unit and/or platform 1000 is in a single stationary orientation.

As shown in FIG. 10, first scan zone 1011A may be near a second scan zone 1011B. The first scan zone may represent a portion of a scan-able region 1012A at a first location of the build unit and/or may represent a first position of the build platform 1000 with respect to the build unit, for example. A second scan zone 1011B may represent a portion of a scan-able region 1012B at a second location of the build unit and/or platform 1000. The first scan zone may be irradiated to form a series of solidification lines 1018A which may be formed across the entire surface of the build zone 1011A and or may be bounded by a single and/or plurality of stripes 1006A. It is noted however, that this example is not limiting, for example, the first scan zone 1012A may be formed using any of the abovementioned and incorporated raster scan schemes. Likewise, the second scan zone 1012B may be formed by irradiating the powder along a series of solidification lines 1018B. While not shown in FIG. 10, The stripe and/or solidification line scheme may be varied when forming the first scan zone 1012A and the second scan zone 1012B. It is noted that while arrows 1019 and 1009 show example movements of the build unit in a radial direction of the build platform 1000, the first and second scan zones may be solidified in any order. When forming a layer of the AM build by at least partially solidifying a build material in scan zone 1011A, and 1011B, excessive heat build-up may occur at a space 1013 between the first and second scan zones. Accordingly, any of the abovementioned process parameters may be varied when connecting scan regions 1011A-B.

For example, to decrease the energy density within portion 1013, portion 1013 may be irradiated to form solidification lines (not shown) that have a larger spacing between each solidification line than the solidification lines 1018A-B. As another example, the solidification lines in portion 1013 may be formed at a faster speed than solidification lines 1018A-B in order to decrease the energy density within portion 1013. The energy density may also decreased by defocusing and/or pulsing the irradiation source in portion 1013, and/or by decreasing the wattage of the irradiation source when scanning portion 1013. It is noted that the abovementioned examples can be used exclusively or in combination to control the energy density within portion 1013. Further, portion 1013 may be irradiated either before or after formation of the adjoining scan zone. For example, the AM apparatus may be configured to form solidification lines 1018A to at least partially solidify the build material within scan zone 1011A, after which the build unit may be moved in a radial direction 1019 to at least partially solidify the build material within scan zone 1011B, after the solidification lines 1018A in scan zone 1011B are formed, the build unit may remain stationary and form the solidification lines in portion 1013 at modified process parameters to adjust the energy density of region 1013.

As another example, scan zones 1001A and 1001B may also be formed at two separate positions of the build unit. Similarly to the scenario above, because of the overlap of each scan-able region 1002A-B, portion 1003 may be formed by the build while the build unit remains stationary after any single or multiple scan zones are formed that border portion 1003. It is further noted that portions 1013 and/or 1003 could be formed by moving the build unit to an intermediate position between each of the scan zones 1011A-B and/or 1001A-B as well.

It is noted that FIG. 10 shows a limited number of possible positions for simplicity purposes, it each of the abovementioned examples, the build unit may further progress to any position within the build area 1000 to at least partially solidify a region and the same inventive principles may be applied. Further, it is noted that either in combination with the build unit moving or while the build unit is stationary, the build platform 1000 may be moved to move a new scan zone under the build unit. One having ordinary skill in the art would further appreciate that the abovementioned scan zones could be solidified in any desired order and the examples are not limiting. Further, one having skill in the art would further appreciate that the current invention could be applied to various possible AM build scenarios over each layer being formed.

This written description uses examples to disclose the invention, including the preferred embodiments, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims. Aspects from the various embodiments described, as well as other known equivalents for each such aspect, can be mixed and matched by one of ordinary skill in the art to construct additional embodiments and techniques in accordance with principles of this application.

What is claimed is:

1. A method for forming a component comprising:
forming an at least partially solidified portion within a first scan region, wherein the solidified portion within the first scan region is formed by irradiating a build material at a first energy density value along a first irradiation path;
forming an at least partially solidified portion within a second scan region that is spaced with respect to the first scan region, wherein the at least partially solidified portion within the second scan region is formed by irradiating a build material at a second energy density value along a second irradiation path, wherein the space between the first scan region and the second scan region is at least partially solidified by irradiating a build material at a third energy density value that is different from the first energy density value and the second energy density value.

2. The method for forming the component of claim 1, wherein the third energy density value is less than the first energy density value and less than the second energy density value.

3. The method of forming the component of claim 1, wherein the at least partially solidified portion within the first scan region is formed when a build unit is at a first location with respect to the component, and the at least partially solidified portion within the second scan region is formed when the build unit is at a second location different from the first location.

4. The method of forming the component of claim 1, wherein the first scan region and the second scan region are located on a mobile build platform, wherein the solidified portion within the first scan region is formed when the mobile build platform is in a first location with respect to a build unit and the at least partially solidified portion within the second scan region is formed when the mobile build platform is in a second location with respect to the build unit.

5. The method for forming the component of claim 1, wherein the energy density value is altered by changing at least one of an electron beam power, a laser power, a scan speed, and a scan spacing.

6. The method for forming the component of claim 1, wherein at least two of the first scan region, the second scan region, or the third scan region is formed utilizing a laser, and wherein an energy density of the laser is altered between at least two of the first energy density value, the second energy density value, or the third energy density value by changing at least a laser power, wherein the laser power is adjusted by controlling the focus of the laser using a focus control mechanism.

7. The method for forming the component of claim 6, wherein the laser power is adjusted by controlling the surface area over which the laser is in focus.

8. The method for forming the component of claim 6, wherein the focus control mechanism includes at least one lens.

9. The method for forming the component of claim 1, wherein at least two of the first scan region, the second scan region, or the third scan region is formed utilizing a laser, and wherein an energy density of the laser is altered between at least two of the first energy density value, the second density value, or the third energy density value by changing at least a laser power, wherein the laser power is adjusted by controlling the wattage of the laser.

10. The method for forming the component of claim 1, where in the energy density value is altered by changing at least a scan speed, wherein the scan speed is adjusted by controlling a galvanometer scanner.

11. The method for forming the component of claim 1, wherein the first irradiation path comprises a series of solidification lines formed at a first angle, wherein the second irradiation path comprises a series of solidification lines formed at a second angle, wherein the space between the first scan region and the second scan region is at least partially solidified by forming a third series of solidification lines formed at an angle different from the first angle and the second angle.

12. A non-transitory computer readable medium comprising computer-executable instructions, which when executed by a processor associated with an additive manufacturing machine, cause the additive manufacturing machine to execute an additive manufacturing method, the manufacturing method comprising:
forming an at least partially solidified portion within a first scan region, wherein the solidified portion within the first scan region is formed by irradiating a build material at a first energy density value along a first irradiation path;
forming an at least partially solidified portion within a second scan region that is spaced with respect to the first scan region, wherein the solidified portion within the first scan region is formed by irradiation a build material at a second energy density value along a second irradiation path, wherein the space between the first scan region and the second scan region is at least partially solidified by irradiating a build material at a third energy density value that less than the first energy density value and the second energy density value.

13. The non-transitory computer readable medium of claim 12, wherein the third energy density value is less than the first energy density value and less than the second energy density value.

14. The non-transitory computer readable medium of claim 12, wherein the at least partially solidified portion within the first scan region is formed when a build unit is at a first location with respect to the component, and the at least partially solidified portion within the second scan region is formed when the build unit is at a second location different from the first location.

15. The non-transitory computer readable medium of claim 12, wherein the first scan region and the second scan region are located on a mobile build platform, wherein the solidified portion within the first scan region is formed when the mobile build platform is in a first location with respect to a build unit and the at least partially solidified portion within the second scan region is formed when the mobile build platform is in a second location with respect to the build unit.

16. The non-transitory computer readable medium of claim 12, wherein at least two of the first scan region, the second region, or the third scan region is formed utilizing a laser, and wherein an energy density of the laser is altered between at least two of the first energy density value, the second energy density value, or the third energy density value by changing at least one of an electron beam power, laser power, a scan speed, and a scan spacing.

17. The non-transitory computer readable medium of claim 12, wherein at least two of the first scan region, the second region, or the third scan region is formed utilizing a laser, and wherein an energy density of the laser is altered between at least two of the first energy density value, the second energy density value, or the third energy density value by changing at least a laser power, wherein the laser power is adjusted by controlling the focus of the laser using a focus control mechanism.

18. The non-transitory computer readable medium of claim 17, wherein the focus control mechanism includes at least one lens.

19. The non-transitory computer readable medium of claim 12, wherein at least two of the first scan region, the second scan region, or the third scan region is formed utilizing a laser, and wherein an energy density of the laser is altered between at least two of the fist density value, the second energy density value, or the third energy density value by changing at least a laser power, wherein the laser power is adjusted by controlling the wattage of the laser.

20. The non-transitory computer readable medium of claim 12, where in an energy density value is altered between at least two of the first energy density value, the second energy density value, or the third energy density value by changing at least a scan speed, wherein the scan speed is adjusted by controlling a galvanometer scanner.

21. The non-transitory computer readable medium of claim 12, wherein the first irradiation path comprises a series of solidification lines formed at a first angle, wherein the second irradiation path comprises a series of solidification lines formed at a second angle, wherein the space between the first scan region and the second scan region is at least partially solidified by forming a third series of solidification lines formed at an angle different from the first angle and the second angle.

* * * * *